US007719658B2

(12) United States Patent
Dorsel et al.

(10) Patent No.: US 7,719,658 B2
(45) Date of Patent: May 18, 2010

(54) IMAGING SYSTEM FOR A MICROLITHOGRAPHICAL PROJECTION LIGHT SYSTEM

(75) Inventors: Andreas Dorsel, Aalen (DE); Toralf Gruner, Aalen-Hofen (DE); Bernhard Kneer, Altheim (DE); Susanne Beder, Aalen (DE); Alexander Epple, Aalen (DE); Norbert Wabra, Werneck (DE)

(73) Assignee: Carl Zeiss SMT AG, Oberkochen (DE)

( * ) Notice: Subject to any disclaimer, the term of this patent is extended or adjusted under 35 U.S.C. 154(b) by 630 days.

(21) Appl. No.: 10/597,776

(22) PCT Filed: Jan. 13, 2005

(86) PCT No.: PCT/EP2005/000277

§ 371 (c)(1),
(2), (4) Date: May 4, 2007

(87) PCT Pub. No.: WO2005/081068

PCT Pub. Date: Sep. 1, 2005

(65) Prior Publication Data

US 2007/0285637 A1    Dec. 13, 2007

Related U.S. Application Data

(60) Provisional application No. 60/544,967, filed on Feb. 13, 2004.

(51) Int. Cl.
G03B 27/52    (2006.01)
G03B 27/42    (2006.01)
G03B 27/54    (2006.01)
G03B 27/32    (2006.01)

(52) U.S. Cl. .............................. 355/30; 355/53; 355/67; 355/77

(58) Field of Classification Search .................. 355/39, 355/53, 67, 72, 77, 30
See application file for complete search history.

(56) References Cited

U.S. PATENT DOCUMENTS 4,346,164 A    8/1982    Tabarelli et al.
(Continued)

FOREIGN PATENT DOCUMENTS

DE            221563          4/1985
(Continued)

OTHER PUBLICATIONS

Burnett et al., "High Index Materials for 193 nm immersion Lithography", International Symposium on Immersion & 157 nm Lithography, Feb. 8, 2004, pp. 3, figure 1.
(Continued)

*Primary Examiner*—Alan A Mathews
(74) *Attorney, Agent, or Firm*—Fish & Richardson P.C.

(57) ABSTRACT

Imaging system of a microlithographic projection exposure apparatus, with a projection objective (200, 300, 500, 600) that serves to project an image of a mask which can be set into position in an object plane onto a light-sensitive coating layer which can be set into position in an image plane, and with a liquid-delivery device (205) serving to fill immersion liquid (202, 310, 507) into an interstitial space between the image plane and a last optical element (201, 309, 506) on the image-plane side of the projection objective; wherein the last optical element on the image-plane side of the projection objective is arranged so that, seen in the direction of gravity, it follows the image plane; and wherein the projection objective is configured in such a way that when the system is operating with immersion, the immersion liquid has at least in some areas a convex-curved surface facing in the direction away from the image plane. It is also proposed for the last optical element (201, 309, 506) on the image-plane side of the projection objective to be arranged below the image plane in such a way that the immersion liquid (202, 310, 507, 601) is held at least in part in a substantially tub-shaped area on the last optical element on the image-plane side. Also, a rotator can be provided which serves to rotate a substrate carrying the light-sensitive coating (401) between a transport orientation in which the light-sensitive coating lies on a substrate surface that faces against the direction of gravity and an exposure orientation in which the light-sensitive coating (401) lies on a substrate surface that faces in the direction of gravity.

27 Claims, 5 Drawing Sheets

U.S. PATENT DOCUMENTS

| | | |
|---|---|---|
| 4,890,903 A | 1/1990 | Treisman et al. |
| 5,220,454 A * | 6/1993 | Ichihara et al. ............ 359/487 |
| 5,446,591 A | 8/1995 | Medlock |
| 5,627,674 A | 5/1997 | Robb |
| 5,682,263 A | 10/1997 | Robb et al. |
| 5,900,354 A | 5/1999 | Betchelder et al. |
| 6,169,627 B1 | 1/2001 | Schuster |
| 6,181,485 B1 | 1/2001 | He |
| 6,496,306 B1 | 12/2002 | Shafer et al. |
| 6,636,349 B2 * | 10/2003 | Takahashi et al. .......... 359/351 |
| 6,781,670 B2 * | 8/2004 | Krautschik ................. 355/53 |
| 6,809,794 B1 | 10/2004 | Sewell |
| 7,187,503 B2 | 3/2007 | Rostalski et al. |
| 2002/0163629 A1 | 11/2002 | Switkes et al. |
| 2002/0196533 A1 | 12/2002 | Shafer et al. |
| 2003/0174408 A1 | 9/2003 | Rostalski et al. |
| 2003/0224528 A1 | 12/2003 | Chiou et al. |
| 2004/0075895 A1 | 4/2004 | Lin |
| 2004/0105170 A1 | 6/2004 | Krahmer et al. |
| 2004/0109237 A1 | 6/2004 | Epple et al. |
| 2004/0125351 A1 | 7/2004 | Krautschik |
| 2005/0002004 A1* | 1/2005 | Kolesnychenko et al. ..... 355/30 |
| 2005/0024609 A1 | 2/2005 | De Smit et al. |
| 2005/0068499 A1 | 3/2005 | Docdoc et al. |
| 2005/0074704 A1 | 4/2005 | Endo et al. |
| 2005/0117224 A1 | 6/2005 | Shafer et al. |
| 2005/0161644 A1 | 7/2005 | Zhang et al. |
| 2005/0179877 A1 | 8/2005 | Mulkens et al. |
| 2005/0190435 A1 | 9/2005 | Shafer et al. |
| 2005/0190455 A1 | 9/2005 | Rostalski et al. |
| 2005/0219707 A1 | 10/2005 | Schuster et al. |
| 2005/0225737 A1 | 10/2005 | Weissenreider et al. |
| 2005/0248856 A1 | 11/2005 | Omura et al. |
| 2006/0012885 A1 | 1/2006 | Beder et al. |
| 2006/0023188 A1* | 2/2006 | Hara ............................ 355/53 |
| 2006/0066962 A1 | 3/2006 | Totzeck et al. |
| 2006/0077369 A1* | 4/2006 | Wagner ....................... 355/55 |
| 2006/0187430 A1 | 8/2006 | Docdoc et al. |
| 2006/0221456 A1 | 10/2006 | Shafer et al. |
| 2006/0221582 A1 | 10/2006 | DeNies et al. |
| 2006/0244938 A1 | 11/2006 | Schuster |
| 2007/0052936 A1 | 3/2007 | Neijzen et al. |
| 2007/0091451 A1 | 4/2007 | Schuster |
| 2007/0109659 A1 | 5/2007 | Rostalski et al. |
| 2007/0165198 A1 | 7/2007 | Kneer et al. |

FOREIGN PATENT DOCUMENTS

| | | |
|---|---|---|
| DE | 224448 | 7/1985 |
| EP | 0023231 | 2/1981 |
| EP | 0291596 | 1/1994 |
| EP | 1420302 | 5/2004 |
| EP | 1 489 462 | 12/2004 |
| EP | 1 491 956 | 12/2004 |
| EP | 1486827 | 12/2004 |
| EP | 1522894 | 4/2005 |
| EP | 1524558 | 4/2005 |
| EP | 1 557 721 | 7/2005 |
| EP | 1 630 616 | 3/2006 |
| EP | 1 645 911 | 4/2006 |
| JP | 07220990 | 8/1995 |
| JP | 10-228661 | 8/1998 |
| JP | 10-303114 | 11/1998 |
| JP | 2000-58436 | 2/2000 |
| WO | WO 01/50171 | 7/2001 |
| WO | WO 02/093209 | 11/2002 |
| WO | WO 2004/019128 | 3/2004 |
| WO | WO 2004/057589 | 7/2004 |
| WO | WO 2004/090956 * | 10/2004 |
| WO | WO 2004/107048 | 12/2004 |
| WO | WO 2005/006026 | 1/2005 |
| WO | WO 2005/031823 | 4/2005 |
| WO | WO 2005/059617 | 6/2005 |
| WO | WO 2005/059618 | 6/2005 |
| WO | WO 2005/059645 | 6/2005 |
| WO | WO 2005/081067 | 9/2005 |
| WO | WO 2006/045748 | 5/2006 |

OTHER PUBLICATIONS

Kawata et al., "Fabrication of 0.2mm Fine Patterns Using Optical Projection Lithography With an Oil Immersion Lens", Japanese Journal of Applied Physics, Japan Society of Applied Physics, Tokyo, Japan, vol. 31 No. 12B, Part 1, Dec. 1, 1992, pp. 4174-4177.

Owa et al., "Immersion Lithography; its Potential Performance Issues", Proceeding of the SPIE, SPIE, Bellingham, VA, vol. 5040 No. 1, Feb. 28, 2003, pp. 724-733.

Lammers, "'Doped water' could extend 193-nm immersion litho," *EETimes Online*, http://ww.eetimes.com/showArticle.jhtml?articleID=18310517, 2 pages (Jan. 28, 2004).

J.A. Hoffnagle et al., "Liquid Immersion Deep-Ultraviolet Interferometric Lithography", Journal of Vacuum Science &: Technology B:Microelectronics Processing and Phenomena, American Vacuum Society, New York, NY, vol. 17, No. 6, Nov. 1999 (199-11) pp. 3306-3309.

Smith, Bruce, "Water-based 193nm Immersion Lithography", Online!, http://www.sematech.org/resources/litho/meetings/immersion/20040128/presentations/06%20rit20$microstepper%20effortsSmith.pdf. , (Jan. 28, 2004).

* cited by examiner

IMAGING SYSTEM FOR A MICROLITHOGRAPHICAL PROJECTION LIGHT SYSTEM

BACKGROUND OF THE INVENTION

1. Field of the Invention

The invention relates to an imaging system of a microlithographic projection exposure apparatus which is specifically configured to operate with immersion.

2. State of the Art

A known means to achieve ever higher levels of resolution in microlithography, besides using projection objectives of high numerical aperture and using light of shorter and shorter wavelength, consists of introducing an immersion medium of a high refractive index, in particular a liquid, into the space between the last optical element on the image-plane side of the projection objective and the light sensitive coating layer. This technique is referred to as immersion lithography.

The known state of the art of projection objectives includes a number of diverse designs that serve to improve the handling of the immersion liquid during the scanning activity which is performed in the production of wafers and in which a relative movement occurs in particular between the last optical element and the light-sensitive coating.

The following references to examples for designs of projection objectives are presented to delineate the state of the art, albeit without any claims of completeness and without a definitive assessment of their merits.

A projection exposure apparatus is disclosed in JP 2000-058436A, which is designed so that a supplementary lens can be inserted into the interstitial space between a projection objective that is configured as a dry objective and a light-sensitive coating layer, wherein the supplementary lens can in particular have a concave curvature on the image side. An immersion fluid, for example an oil, can be introduced between the inserted lens and the light-sensitive coating.

In WO 2004/090956, a projection exposure apparatus is disclosed with a movable substrate stage which serves to hold the substrate over the projection objective and with an immersion liquid to fill the remaining space in between at least partially with immersion liquid. The intended purpose is in particular to prevent the immersion liquid from escaping ("scattering") and to avoid impeding the movement of the substrate stage with immersion liquid conduits.

A system for immersion photolithography is disclosed in U.S. Pat. No. 6,809,794 wherein the projection objective is likewise positioned below the substrate that is to be exposed. According to the example in which the concept is implemented, there are in particular a plurality of lenses arranged in a housing with an opening at the top which is designed so that an immersion liquid which is present in a pressure region between the last lens (shown as a bi-convex lens) and the top portion of the housing will form a liquid meniscus above the projection objective or, more specifically, over the opening.

SUMMARY OF THE INVENTION

The object of the present invention is to propose an alternative design of an imaging system of a microlithographic projection exposure apparatus, so that the latter can be reliably operated with immersion with a simple handling procedure for the immersion liquid.

This task is solved through the features of the independent patent claims 1, 18 and 19.

According to the invention, the last optical element on the image-plane side of the projection objective is arranged so that in the direction of gravity the last optical element follows the image plane, and the projection objective is designed so that in the immersion mode the immersion liquid has at least in part a convex curvature facing in the direction away from the image plane.

Specifically to meet this condition, the last optical element towards the image plane has a concave surface curvature adjoining the immersion liquid.

The concept according to the invention wherein the measure of arranging the last optical element of the projection objective so that it follows after the image plane in the direction of gravity, i.e., "below" the image plane, is combined with giving the last optical element a concave curvature on the image side has in particular the following advantages:

a) The last optical element on the image-plane side forms with its concave-curved border surface a kind of tub for the immersion liquid, where the immersion liquid can gather even due to gravity alone without requiring any action from the outside, in particular pressurization.

b) During a scanning activity it is unavoidable that at the border contact between the last lens element or housing of the objective and the substrate surface or light-sensitive surface, a part of the immersion liquid escapes, which will then have to be suctioned off and continuously replenished. Air bubbles which in the course of replenishing the liquid may enter into the space between the last lens element and the substrate surface (and which as a rule are extremely difficult to remove in conventional systems) are "flushed away" practically on their own in the arrangement according to the invention solely through the replenishing of the immersion liquid, as a consequence of the spreading or gathering of the immersion liquid in the tub-like area which occurs under the influence of gravity.

c) The gravitation-supported spreading or gathering of the immersion liquid in the tub-like area facilitates the assurance of a durable and reliable wetting of the image-plane-facing surface of the last lens element, so that the latter can also be provided with coatings that are susceptible to oxidation and which would otherwise have to be avoided.

d) As the inventive concept leads to a lowering of the pressure (for example in the aforementioned removal of air bubbles) while it assures a durable wetting of the image-plane-facing surface of the last lens element, it reduces the pressure-related stress on the last lens element and thus the risk of pressure-related deformations.

e) As the amount of immersion fluid escaping during the scanning activity is lowered as a result of the geometrical arrangement according to the invention, a suctioning device for the escaped liquid, for example a vacuum suction nozzle, can be of a less powerful design.

f) The convex curvature of the immersion liquid in the direction that faces away from the image plane has the effect that only relatively small angles of incidence occur at the border surface from the optically last-positioned lens element to the immersion liquid for projection light that traverses the projection objective from the object plane to the image plane. As a result of these effectively smaller angles of incidence, problems such as an off-setting of the rays at possible manufacturing-related height differences of the optical element and the higher reflection losses associated with higher angles of incidence are avoided. Thus, even rays with relatively large aperture angles relative to the optical axis of the projection objective can contribute to the formation of the image. The beneficial effects which the convex curvature of the immersion liquid in the direction facing away from the image plane has on the optical performance of the projection objective as well as further related advantageous designs are described extensively in U.S. Provisional Patent Application Ser. No. 60/544,967 "Projection Objective for a Microlithographic Projection Exposure Apparatus", filed Feb. 13, 2004, whose disclosure content in its entirety is herewith incorporated by reference in the present disclosure.

According to a preferred embodiment, the image-plane-facing surface of the last optical element towards the image plane has at least substantially the shape of a spherical shell. The curvature radius of the image-plane-facing surface of the last optical element towards the image plane is preferably between 0.9 and 1.5 times as large, and with even stronger preference 1.3 times as large as the axial distance between the last optical element on the image-plane side and the image plane.

A preferred embodiment includes a substrate holder which can be selectively actuated to apply a holding force whereby a substrate carrying the light-sensitive coating is held in an exposure position above the last optical element on the side of the image plane. The substrate holder can for example include a vacuum-suction device.

A system according to a preferred embodiment is equipped with a rotator (for example a wafer-turning device) serving to rotate a substrate carrying the light-sensitive coating between a transport orientation in which the light-sensitive coating lies on a substrate surface that faces against the direction of gravity (meaning that the light-sensitive coating is on top), and an exposure orientation in which the light-sensitive coating lies on a substrate surface that faces in the direction of gravity (i.e., at the bottom). The rotator can be designed to perform the turning over of individual wafers which are taken out of and returned to a wafer-tracking device, or also for the turning over of a wafer-loading unit which carries the wafer.

The image-plane-facing surface of the last optical element on the side of the image plane is preferably surrounded along its perimeter by a catch basin for the immersion fluid.

According to a preferred embodiment, the object plane and the image plane are arranged parallel to each other. In another embodiment, the object plane and the image plane can also be arranged differently, for example perpendicular to each other.

The projection objective in a preferred embodiment is a catadioptric objective with at least two concave mirrors, which produces at least two intermediate images.

The immersion liquid in a preferred embodiment has a higher refractive index than the last optical element on the image side.

The projection objective preferably has a numerical aperture (NA) larger than 0.8, with higher preference larger than 1.2, and with even higher preference larger than 1.4. It is designed preferably for a wavelength of 248 nm, with higher preference for 193 nm, and with even higher preference for 157 nm.

The invention also relates to an imaging system of a microlithographic projection exposure apparatus, with a projection objective that serves to project an image of a mask which can be set into position in an object plane onto a light-sensitive coating layer which can be set into position in an image plane, further with a liquid-delivery device serving to fill immersion liquid into an interstitial space between the image plane and a last optical element on the image-plane side of the projection objective, wherein the last optical element on the image-plane side of the projection objective is arranged below the image plane in such a way that the immersion liquid is held at least in part in a substantially tub-shaped area on the last optical element on the image-plane side.

According to a further aspect, the invention relates to an imaging system of a microlithographic projection exposure apparatus, with a projection objective that serves to project an image of a mask which can be set into position in an object plane onto a light-sensitive coating layer which can be set into position in an image plane, further with a liquid-delivery device serving to fill immersion liquid into an interstitial space between the image plane and a last optical element on the image-plane side of the projection objective, wherein the last optical element on the image-plane side of the projection objective is arranged so that in the direction of gravity it follows the image plane, and wherein a rotator is provided for rotating a substrate carrying the light-sensitive coating between a transport orientation in which the light-sensitive coating lies on a substrate surface that faces against the direction of gravity, and an exposure orientation in which the light-sensitive coating lies on a substrate surface that faces in the direction of gravity.

The rotator in the foregoing arrangement can be designed to perform the turning over of individual wafers which are taken out of and returned to a wafer-tracking device, or also for the turning over of an individual wafer-loading unit which carries the wafer.

In a further aspect, the invention relates to a microlithographic projection exposure apparatus according to claim 26, a method for the microlithographic manufacture of microstructured components according to claim 27, and a microstructured component according to claim 28.

Further developed embodiments of the invention are presented in the description which follows as well as in the subordinate claims.

The invention will be explained hereinafter in more detail with references to the examples illustrated in the attached drawings.

SHORT DESCRIPTION OF THE DRAWINGS

DETAILED DESCRIPTION OF PREFERRED EMBODIMENTS

Figure 1:
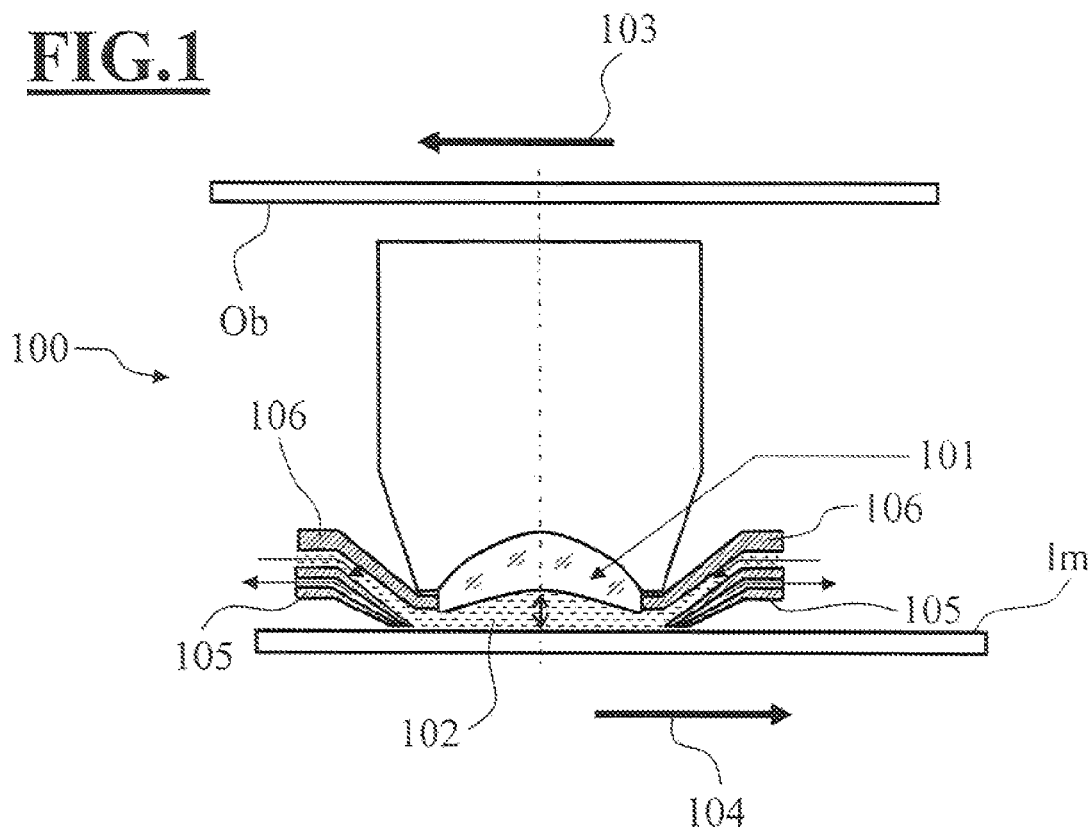
FIGS. 1-2 show schematic representations serving to explain the functional principle of an imaging system designed to operate with immersion, wherein a last optical element of the projection objective with a concave-curved surface on the image side is arranged above (FIG. 1) and below (FIG. 2) the image plane.

FIG. 1 gives a schematic view of an example of a conventional projection objective 100 designed to be operated with immersion and serving to project an object plane "Ob" (containing a mask, specifically a reticle "R") into an image plane "Im" (containing a substrate with a light-sensitive coating, specifically a wafer "W"). The projection objective 100 has a last lens 101 with a concave curvature towards the side of the image plane (in the illustrated example in the form of a meniscus lens of positive refractive power), which is located above the image plane "Im", with an immersion liquid 102 being present between the last lens 101 and the substrate "W" with the light-sensitive coating. When the apparatus is operating in the scanning mode, the reticle "R" and the substrate "W" move relative to each other in opposite directions as indicated by the arrows 103 and 104, so that in particular a relative movement takes place between the stationary projection objective 100 and the wafer "W" which in the illustrated example moves sideways to the right at a substantially constant gap distance. Immersion liquid 102 which during this relative movement escapes from the interstitial space is suctioned off by means of a vacuum nozzle 105 in order to avoid a contamination of the surrounding substrate surface, and to prevent depletion of the liquid in the interstitial space, liquid is continuously replenished through a liquid inlet 106 (which is connected to a liquid reservoir as well as a pump device that are not shown).

Figure 2:
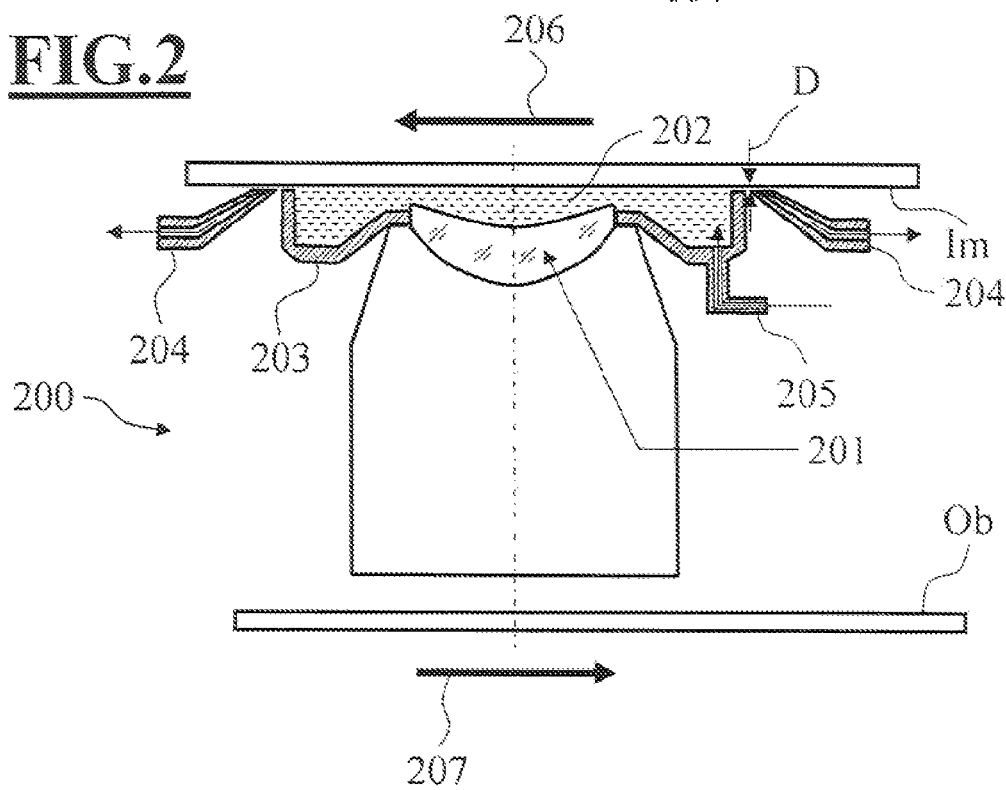

The imaging system according to the invention as outlined in FIG. 2 with a projection objective 200 has an inverted design structure in comparison to the imaging system of FIG. 1, insofar as a last lens 201 with a concave curvature towards the image plane is arranged below, i.e., following the image plane "Im" in the direction of gravity, so that the immersion liquid 202 which is present in the interstitial space has a convex curvature in the direction facing away from the image plane "Im". A catch basin 203 for the immersion liquid 202 which is also illustrated in FIG. 2 is arranged around the circumference and is connected to a liquid inlet 205 which serves to replenish the immersion liquid which escapes from the gap "D" when the system operates in the scanning mode and which is removed through a vacuum suction nozzle 204. The illustrated arrangement of a vacuum suction nozzle 204 and a liquid inlet 205 is intended only as an example and not as a limitation, meaning that the nozzle and inlet could also be arranged at any other desired location. When the system is performing a scan, the reticle "R" and the substrate "W" move in opposite directions relative to each other as indicated by the arrows 206 and 207.

The invention is not limited to any particular optical design of the projection objective, as the latter can be configured in any desired way as a catadioptric, catoptric or dioptric objective. The invention can further be realized in a projection exposure apparatus working in the "step-and-scan" mode as well as in the "scan-and-repeat" mode.

The invention is further not limited to any particular immersion liquid, as the latter could be for example de-ionized water or also, with preference, an immersion liquid with a refractive index larger than the refractive index of the material of the last optical element on the side that faces towards the image plane. If the material used in the last optical element is for example quartz glass or calcium fluoride, a liquid can be chosen whose refractive index is greater than 1.56 or 1.5, respectively, a condition which can be achieved for example if sulfates, alkaline substances such as for example Cesium, or phosphates are added to water.

Figure 3:
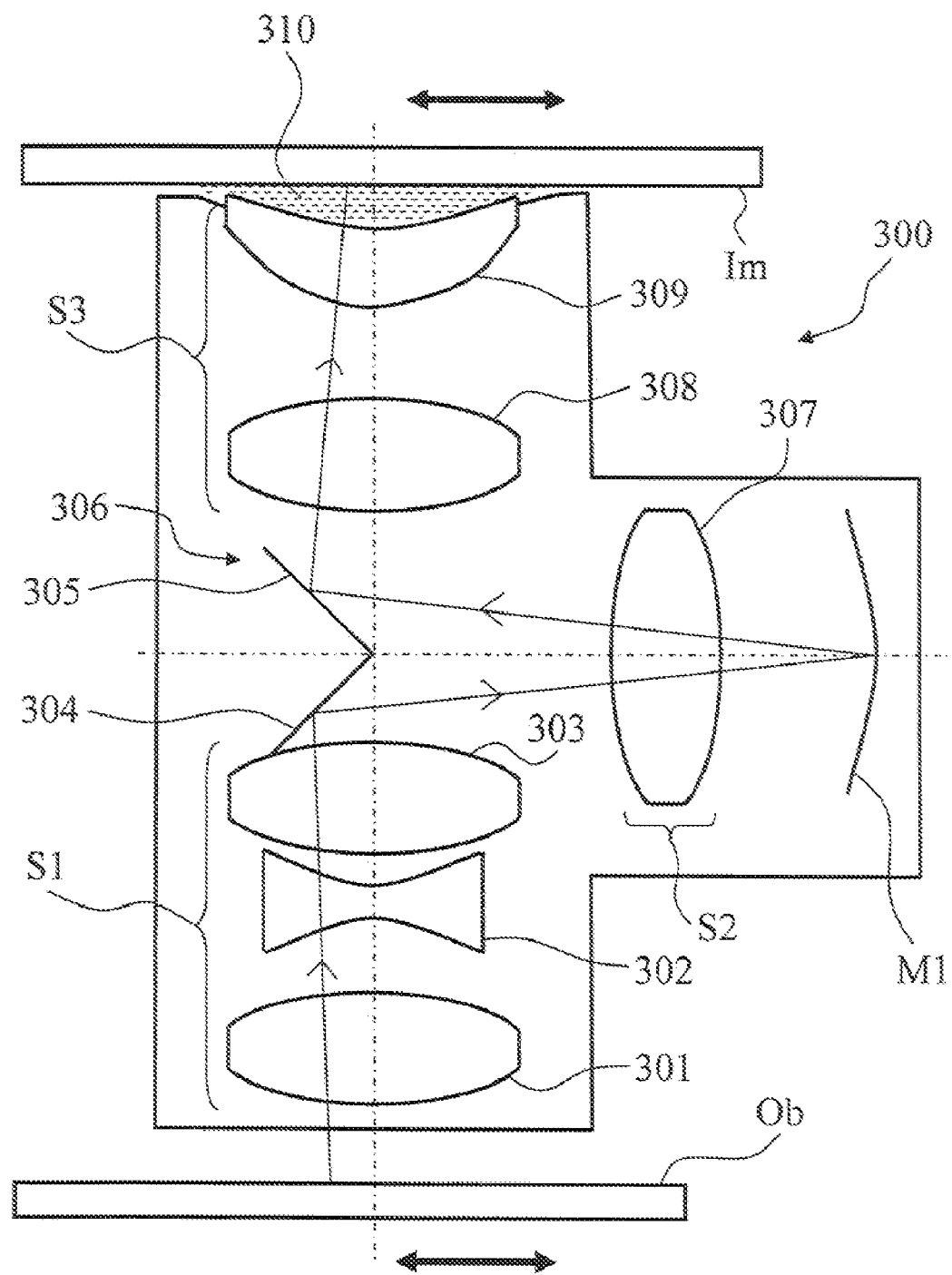
FIG. 3 shows a schematic overall cross-section of a projection objective according to a first embodiment of the invention.

FIG. 3 illustrates schematically and only as an example how the invention can be realized in a catadioptric projection objective 300 which has between the mutually parallel-aligned object plane "Ob" and image plane "Im" a ray-deflecting arrangement 306 consisting of two deflecting mirror surfaces 304 and 305 arranged between refractive lens groups S1 (with lenses 301-303) and S3 (with lenses 308-309) and serving to redirect the rays of projection light arriving from the first refractive lens group S1 through a further refractive lens or lens group S2 (with lens 307) to a concave mirror M1 and then to redirect the returning projection light through the second lens group S3 to the image plane "Im". In the interstitial space between the last lens 309 on the image-plane side of the objective and the image plane "Im" (more specifically the substrate arranged on the latter and carrying the light-sensitive coating) there is an immersion liquid 310 which is brought in through the liquid-delivery device (not shown), with the last lens 309 towards the image plane again having a concave-curved surface bordering on the immersion liquid 310. The system can have further elements that serve for the handling of the immersion liquid 310 and are known per se (e.g., vacuum suction nozzle, catch basin, etc.), analogous to the description of FIGS. 1 and 2.

The illustration showing the last optical element towards the image plane as a positive meniscus lens is meant only as an example and not as a limitation. In this place it is also possible to use a different optical element which has at least in some parts a concave curvature facing towards the image plane, which includes for example a planar-concave lens or another optical element which is at least in parts concave-curved towards the image plane.

Further, between the last optical element on the image side of the projection objective and the immersion liquid there can also be an intermediate liquid which does not enter into a mixture with the immersion liquid and which under the influence of an electric field forms a curved border surface against the immersion liquid, wherein to attain this condition, e.g., the intermediate liquid can be electrically conductive (for example water doped with ions) and the immersion liquid can be electrically insulating (for example an oil or naphthalene), and a ring-shaped conical electrode can be arranged between the optical element on the image side and the image plane, so that by changing a voltage applied to the electrode, the curvature of the border surface can be changed, as has been explained in detail in the aforementioned U.S. Provisional Patent Application Ser. No. 60/544,967 "Projection objective for a microlithographic projection exposure apparatus", filed on Feb. 13, 2004.

As shown in FIG. 3, not only the last optical element 309 on the side of the image plane is arranged below the image plane "Im", i.e., following the latter in the direction of gravity, but the entire projection objective 300 together with the object plane "Ob" containing the position-adjustable mask (reticle) "R". However, the invention is not limited to this specific arrangement, but the possibilities include in principle any design concept in which the last optical element on the side of the image plane is arranged below the image plane "Im", i.e., following the latter in the direction of gravity. Consequently, the other optical elements of the projection objective and in particular the object plane "Ob" with the mask (reticle) "R" which can be set into position in the object plane can be arranged with any desired orientation.

In the following, a preferred way will be described for incorporating the imaging system according to the invention into an apparatus for the microlithographic manufacture of microstructured components such as, e.g., wafers. This solution allows all operating steps which precede and follow the scanning process of the exposure in the projection objective (such as, e.g., applying the light-sensitive coating, thermal treatment, measurements to check the components, etc.) to be performed with an orientation of the substrate or wafer where the light-sensitive coating is on top (i.e. on the substrate surface that faces against the direction of gravity). Consequently, no adaptation is required in the devices which are used to perform the preceding and subsequent operating steps which are, as a rule, designed for an orientation of the substrate where the light-sensitive coating lies "on top".

Figure 4:
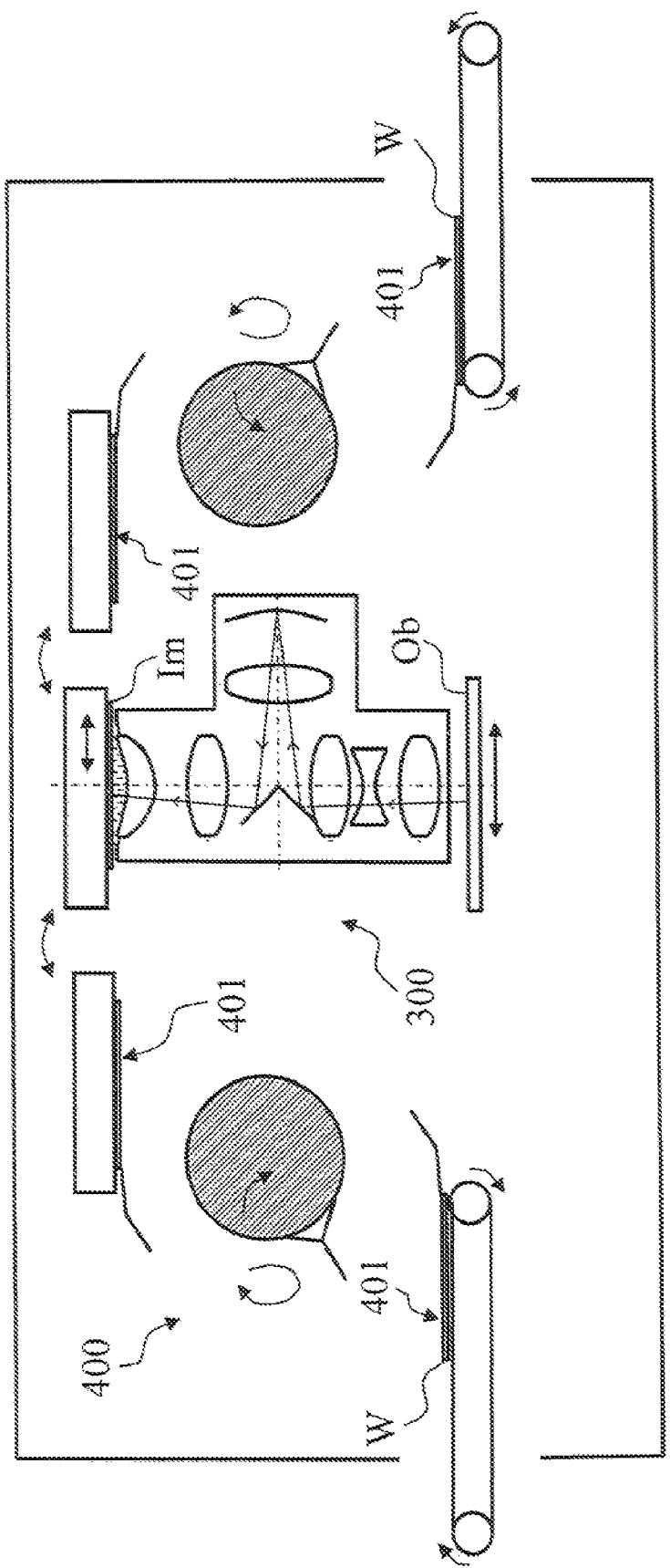
FIG. 4 shows a schematic representation serving to explain a wafer rotator used in the inventive projection objective of FIG. 3.

As illustrated in FIG. 4, the foregoing concept is realized by using a wafer-turning device 400 which turns the substrate "W" carrying the light-sensitive coating substantially by 180° about a horizontal axis, so that the substrate is arranged for the exposure with the orientation required by the invention with the light-sensitive coating "lying at the bottom" (i.e. facing towards the last optical element of the projection objective). After the exposure has been completed, the substrate is turned over again into the orientation with the light-sensitive coating 401 "on top" as shown in the right-hand part of FIG. 4. Both rotations can be performed with an individual substrate or wafer taken from a tracking device or also by turning a wafer-loading unit, for example a wafer cartridge.

The above-described wafer-turning device 400 is not limited to being used in an imaging system with a concave curvature of the last optical element on the side of the image plane (i.e., where the immersion liquid has a convex-curved surface in the direction facing away from the image plane), but its use is quite generally advantageous in an imaging system with an inverted design arrangement in the sense of the invention, where the last lens on the side of the image plane lies below the image plane, i.e. following the latter in the direction of gravity. According to a further aspect, the invention therefore also relates to an imaging system with a wafer-turning device where the last lens on the side of the image plane can be of an arbitrary configuration (such as for example planar-parallel or bi-convex).

Figure 5:
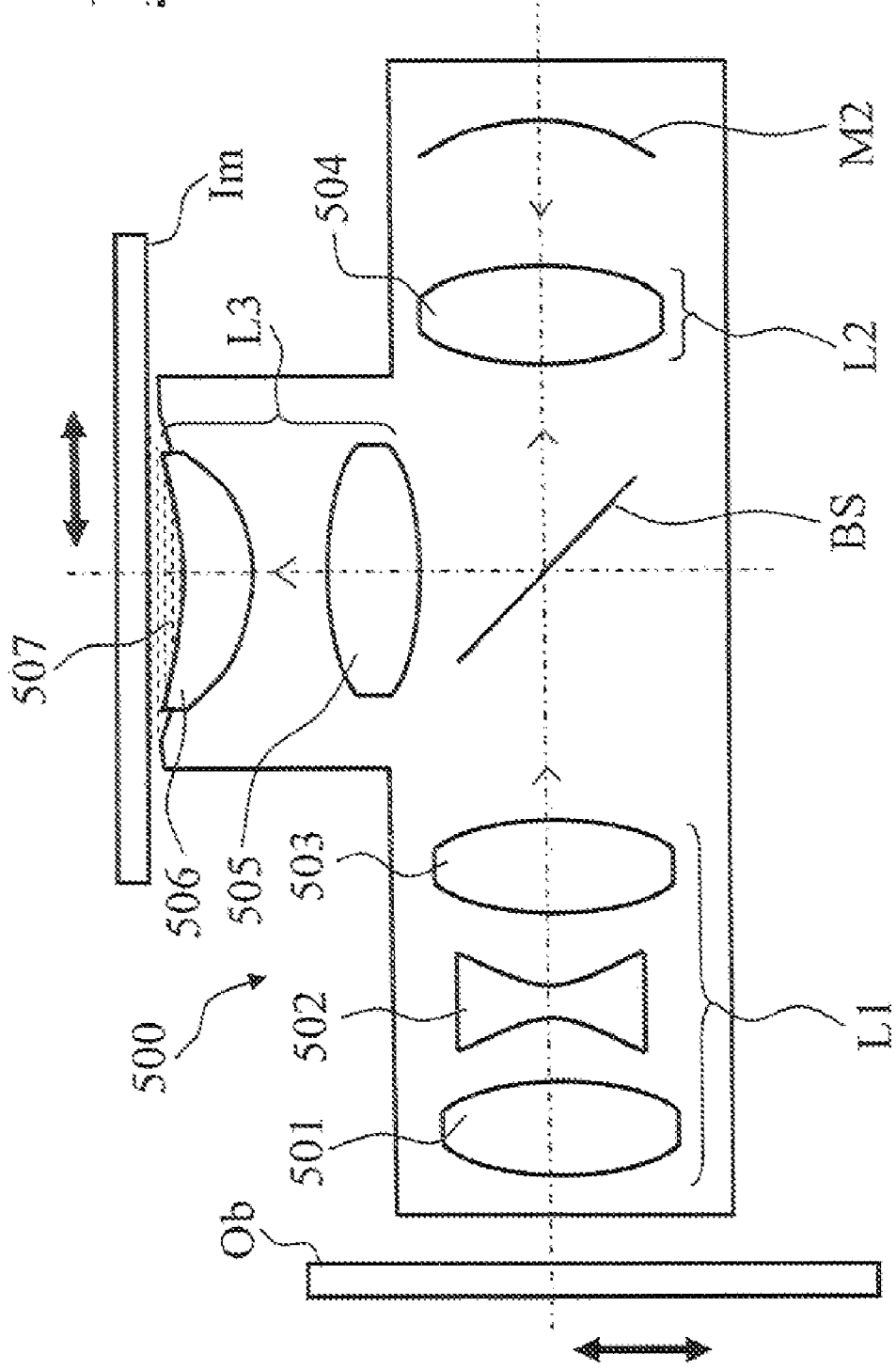
FIG. 5 shows a schematic overall cross-section of a projection objective according to a second embodiment of the invention.

FIG. 5 illustrates an example where the invention is realized with a catadioptric projection objective which has between the mutually parallel-aligned object plane "Ob" and image plane "Im" a first refractive lens group L1 (with lenses 501-503), a beam splitter BS, a further refractive lens or lens group L2 (with lens 504) and a concave mirror M2. The projection light reflected by the concave mirror M2, after traversing the lens or lens group L2, is reflected partially by the beam splitter BS and, after passing through a further refractive lens group L3 (with lenses 505-506) reaches the image plane "Im", where again an immersion liquid 507 is present in the space between the image-plane side of the last lens 506 and the image plane "Im" (or the substrate "W" with the light-sensitive coating which is arranged in the image plane), and where the last lens 506 on the image-plane side again has concave-curved surface bordering on the immersion liquid 507.

Thus according to FIG. 5, the last optical element on the image-plane side is again arranged below the image plane, i.e., following the latter in the direction of gravity. However, due to the folded arrangement of the light path, the object plane "Ob", and specifically the mask (reticle) "R" that can be set into position in the object plane, are arranged perpendicular to the image plane "Im". In a further variation of the concept and with different folded arrangements of the light path, it is possible to achieve any desired orientation of the object plane in relation to the image plane. Furthermore, the description of the lens groups, mirrors and other optical elements such as, e.g., beam splitters shown in the drawings is intended to give examples without implying a limitation, and the invention is not restricted to any concrete arrangement of these optical elements or their concrete realization.

Figure 6:
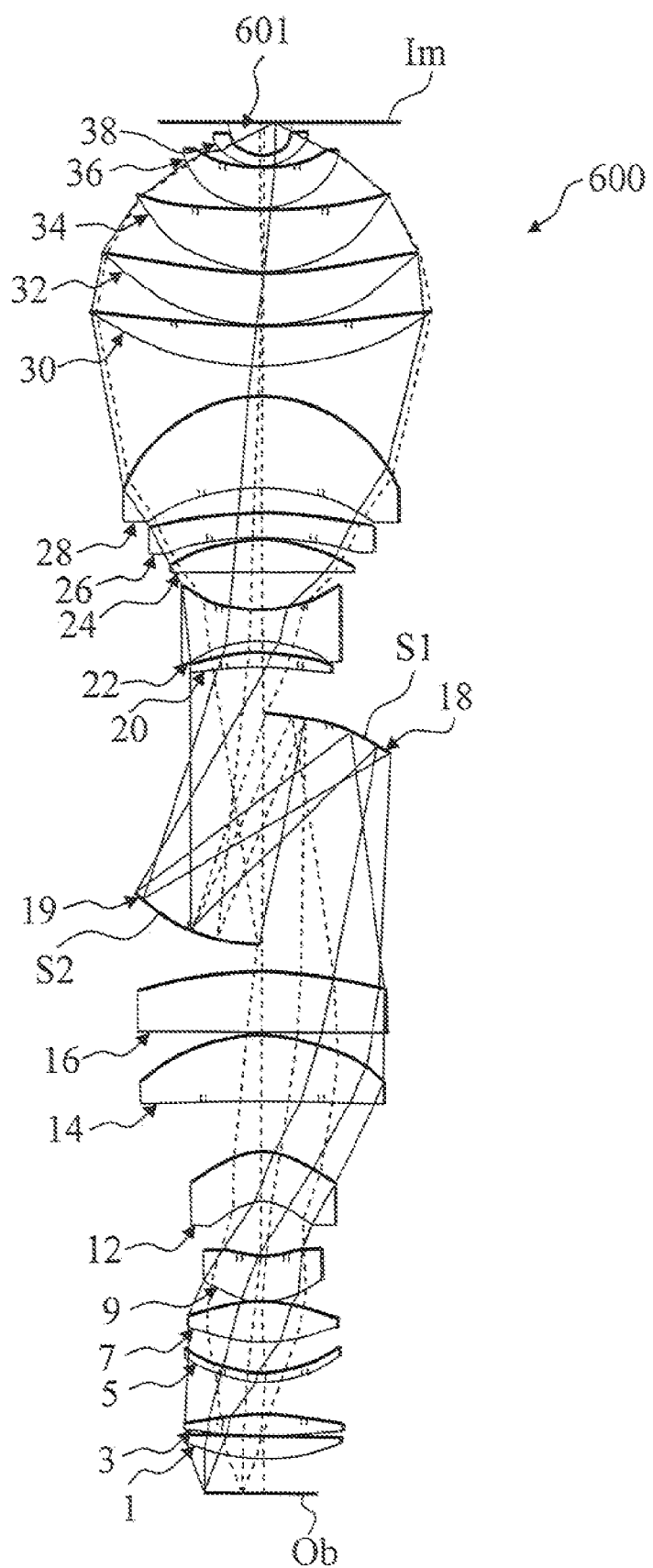
FIG. 6 shows an overall meridional section of a projection objective according to a third embodiment of the invention.

FIG. 6 represents an overall meridional section of a complete catadioptric projection objective 600 according to a further embodiment of the invention.

The design data of the projection objective 600 are listed in Table 1; radii and thickness dimensions are stated in millimeters. The numeral symbols shown above the projection objective 600 indicate selected surfaces of optical elements. Surfaces identified by groups of short horizontal lines have an aspheric curvature. The curvature of these surfaces is expressed by the following formula for aspheres:

$$z = \frac{ch^2}{1 + \sqrt{1 - (1+k)c^2 h^2}} + Ah^4 + Bh^6 + Ch^8 + Dh^{10} + Eh^{12} + Fh^{14} + Gh^{16} + Hh^{18} + Jh^{20}$$

wherein z stands for the sagittal height of the respective surface measured parallel to the optical axis, h stands for the radial distance from the optical axis, $c=1/R$ stands for the curvature at the apex of the respective surface with R representing the curvature radius, k stands for the conical constant, and A, B, C, D, E, F, G, H and J stand for the aspherical constants listed in Table 2. The conical constant k in the present example is set to $k=0$.

The projection objective 600 has two aspherical mirrors S1 and S2 between which two (not optimally corrected) intermediate images are formed. The projection objective 600 is designed for a wavelength of 193 nm and a refractive index $n_L$ of 1.6 of the immersion liquid. The immersion liquid in FIG. 6 is identified as 601. The imaging scale ratio of the projection objective 600 is $\beta=-0.25$, and the numerical aperture is NA=1.4. However, with a few additional improvements it is also easily possible to achieve a numerical aperture that comes close to the refractive index of the immersion medium and thus is only slightly smaller than 1.6.

TABLE 1

Design Data

| Surface | Radius | Asphere | Thickness | Material |
| --- | --- | --- | --- | --- |
| Object Plane | 0 |  | 37.648 |  |
| 1 | 210.931 |  | 21.995 | SiO$_2$ |
| 2 | 909.02 |  | 1.605 |  |
| 3 | 673.572 |  | 22.728 | SiO$_2$ |
| 4 | −338.735 | X | 33.19 |  |
| 5 | 130.215 | X | 8.994 | SiO$_2$ |
| 6 | 119.808 |  | 36.001 |  |
| 7 | 216 |  | 40.356 | SiO$_2$ |
| 8 | −210.59 |  | 0.939 |  |
| 9 | 97.24 |  | 49.504 | SiO$_2$ |
| 10 | 216.208 | X | 8.164 |  |
| 12 | −65.704 |  | 49.734 | SiO$_2$ |
| Aperture Stop | 0 |  | 49.302 |  |
| 13 | −113.325 |  | 55.26 |  |
| 14 | 6210.149 | X | 70.31 | SiO$_2$ |
| 15 | −195.536 |  | 0.962 |  |
| 16 | 3980.16 |  | 65.997 | SiO$_2$ |
| 17 | −473.059 |  | 277.072 |  |
| 18 | −225.942 | X | 246.731 | Mirror |
| 19 | 193.745 | X | 294.3290 | Mirror |
| 20 | −338.56 | X | 17.389 | SiO$_2$ |
| 21 | −206.244 |  | 8.884 |  |
| 22 | −148.97 |  | 34.064 | SiO$_2$ |
| 23 | 129.921 | X | 40.529 |  |
| 24 | −2704.885 |  | 33.192 | SiO$_2$ |
| 25 | −195.599 |  | 0.946 |  |
| 26 | −794.214 | X | 30.169 | SiO$_2$ |
| 27 | −479.39 |  | 24.236 |  |
| 28 | −311.778 | X | 100.056 | SiO$_2$ |
| 29 | −159.333 |  | 28.806 |  |
| 30 | 309.839 |  | 43.609 | SiO$_2$ |
| 31 | 836.077 | X | 0.951 |  |
| 32 | 225.096 |  | 55.667 | SiO$_2$ |
| 33 | 687.556 |  | 0.945 |  |
| 34 | 154.575 |  | 64.278 | SiO$_2$ |
| 35 | 911.8 | X | 0.932 |  |

TABLE 1-continued

Design Data

| Surface | Radius | Asphere | Thickness | Material |
|---------|--------|---------|-----------|----------|
| 36 | 89.986 |   | 44.143 | SiO$_2$ |
| 37 | 199.475 | X | 0.878 |   |
| 38 | 61.984 |   | 9.635 | SiO$_2$ |
| 39 | 35.475 |   | 34.43 | Liquid |

TABLE 2

Aspherical Constants

| | Surface 4 | | Surface 5 | | Surface 10 |
|---|---|---|---|---|---|
| A | 5.36225288E−08 | A | 2.53854010E−08 | A | 4.51137087E−07 |
| B | −5.17992581E−12 | B | −1.22713179E−11 | B | 2.46833840E−11 |
| C | 8.49599769E−16 | C | 1.21417341E−15 | C | 5.78496960E−15 |
| D | −7.57832730E−20 | D | −1.92474180E−19 | D | −4.39101683E−18 |
| E | 3.59228710E−24 | E | 2.08240691E−23 | E | −5.64853356E−22 |
| F | −9.16722201E−29 | F | −9.29539601E−28 | F | 4.95744749E−26 |

| | Surface 14 | | Surface 18 | | Surface 19 |
|---|---|---|---|---|---|
| A | −8.48905023E−09 | A | 1.04673033E−08 | A | −4.11099367E−09 |
| B | 1.45061822E−13 | B | 1.34351117E−13 | B | −9.91828838E−14 |
| C | −6.34351367E−18 | C | 1.03389626E−18 | C | −7.93614779E−19 |
| D | 2.84301572E−22 | D | 5.16847878E−23 | D | −1.66363646E−22 |
| E | −8.24902650E−27 | E | −1.23928686E−27 | E | 5.56486530E−27 |
| F | 1.27798308E−31 | F | 3.09904872E−32 | F | −1.79683490E−31 |

| | Surface 20 | | Surface 23 | | Surface 26 |
|---|---|---|---|---|---|
| A | 1.14749646E−07 | A | −2.87603531E−08 | A | −4.35420789E−08 |
| B | −8.19248307E−12 | B | −9.68432739E−12 | B | −6.70429494E−13 |
| C | 8.78420843E−16 | C | 6.88099059E−16 | C | −4.05835225E−17 |
| D | −1.39638210E−19 | D | −8.70009838E−20 | D | −1.10658303E−20 |
| E | 2.09064504E−23 | E | 9.59884320E−24 | E | 4.80978147E−25 |
| F | −2.15981914E−27 | F | −5.07639229E−28 | F | −5.35014389E−29 |

| | Surface 28 | | Surface 31 | | Surface 35 |
|---|---|---|---|---|---|
| A | −2.70754285E−08 | A | 4.38707762E−09 | A | 1.73743303E−08 |
| B | −1.36708653E−12 | B | −3.69893805E−13 | B | 1.60994523E−12 |
| C | −2.46085956E−17 | C | −4.93747026E−18 | C | −1.71036162E−16 |
| D | 2.26651081E−21 | D | 4.05461849E−22 | D | 1.26964535E−20 |
| E | −1.20009586E−25 | E | −7.59674607E−27 | D | −5.77497378E−25 |
| F | 9.28622501E−30 | F | 5.58403314E−32 | F | 1.55390733E−29 |
|   |   |   |   | G | −1.78430224E−34 |

| | Surface 37 |
|---|---|
| A | 1.04975421E−07 |
| B | 1.94141448E−11 |
| C | −2.31145732E−15 |
| D | 4.57201996E−19 |
| E | −3.92356845E−23 |
| F | 2.35233647E−27 |

The invention claimed is:

1. An imaging system comprising:
a projection objective that serves to project an image of a mask which can be set into position in an object plane onto a light-sensitive coating layer which can be set into position in an image plane; and
a liquid-delivery device serving to fill immersion liquid into an interstitial space between the image plane and a last optical element on the image-plane side of the projection objective;

wherein the last optical element on the image-plane side of the projection objective is arranged so that, seen in the direction of gravity, it follows the image plane;
wherein the projection objective is configured in such a way that when the system is operating with immersion, the immersion liquid has at least in some areas a convex-curved surface facing in the direction away from the image plane; and
wherein the imaging system is configured to be used in a microlithographic projection exposure apparatus, the image-plane-facing surface of the last optical element is shaped on the image-plane side at least substantially like a spherical shell, and the curvature radius of the image-plane-facing surface of the last optical element on the image-plane side is between 0.9 and 1.5 times as large as the axial distance between the last optical element on the image-plane side and the image plane.

2. The imaging system according to claim 1, wherein the last optical element on the image-plane side has a concave-curved surface facing in the direction towards the image plane and bordering on the immersion liquid.

3. The imaging system according to claim 2, wherein the concave-curved surface of the last optical element on the image-plane side extends over an area that substantially fills out the entire contour dimensions of the last optical element as measured parallel to the image plane.

4. The imaging system according to claim 1, wherein a substrate holder is provided which can be selectively actuated to apply a holding force for holding a substrate carrying the light-sensitive coating in an exposure position above the last optical element on the image-plane side.

5. The imaging system according to claim 4, wherein the substrate holder is equipped with a vacuum suction device.

6. The imaging system according to claim 1, wherein a rotator is provided which serves to rotate a substrate carrying the light-sensitive coating between a transport orientation in which the light-sensitive coating lies on a substrate surface that faces against the direction of gravity and an exposure orientation in which the light-sensitive coating lies on a substrate surface that faces in the direction of gravity.

7. The imaging system according to claim 6, wherein the rotator is designed to perform the turning over of individual wafers which can be taken out of and returned to a wafer-tracking device.

8. The imaging system according to claim 6, wherein the rotator is designed to perform the turning over of a wafer-loading unit which carries the wafer.

9. The imaging system according to-claim 1, wherein the image-plane-facing surface of the last optical element on the image-plane side is surrounded along its perimeter by a catch basin for the immersion fluid.

10. The imaging system according to claim 1, wherein the object plane and the image plane are arranged parallel to each other.

11. The imaging system according to claim 1, wherein the object plane and the image plane are perpendicular to each other.

12. The imaging system according to claim 1, wherein the projection objective is a catadioptric objective with at least two concave mirrors, which produces at least two intermediate images.

13. The imaging system according to claim 1, wherein the immersion liquid has a higher refractive index than the last optical element on the image-plane side.

14. The imaging system according to claim 1, wherein the projection objective has a numerical aperture larger than 0.8.

15. The imaging system according to claim 1, wherein the projection objective is designed for a wavelength of 248 nm, preferably for 193 nm, and with even higher preference for 157 nm.

16. A projection exposure apparatus, comprising:
an imaging system,
wherein the projection exposure apparatus is a microlithographic projection exposure apparatus for the manufacture of microstructured components, and the imaging system comprises:
a projection objective that serves to project an image of a mask which can be set into position in an object plane onto a light-sensitive coating layer which can be set into position in an image plane; and
a liquid-delivery device serving to fill immersion liquid into an interstitial space between the image plane and a last optical element on the image-plane side of the projection objective;
wherein the last optical element on the image-plane side of the projection objective is arranged so that, seen in the direction of gravity, it follows the image plane;
wherein the projection objective is configured in such a way that when the system is operating with immersion, the immersion liquid has at least in some areas a convex-curved surface facing in the direction away from the image plane; and
wherein the imaging system is configured to be used in a microlithographic projection exposure apparatus, the image-plane-facing surface of the last optical element is shaped on the image-plane side at least substantially like a spherical shell, and the curvature radius of the image-plane-facing surface of the last optical element on the image-plane side is between 0.9 and 1.5 times as large as the axial distance between the last optical element on the image-plane side and the image plane.

17. A method, comprising:
preparing a substrate which is at least partially covered with a coating of a light-sensitive material;
preparing a mask which carries structures of which an image is to be produced;
preparing a projection exposure apparatus with an imaging system;
projecting at least a part of the mask onto an area of said coating via the projection exposure apparatus while the coating is positioned above the last optical element of the projection objective as seen in the direction towards the coating, to manufacture microstructured components,
wherein the imaging system comprises:
a projection objective that serves to project an image of a mask which can be set into position in an object plane onto a light-sensitive coating layer which can be set into position in an image plane; and
a liquid-delivery device serving to fill immersion liquid into an interstitial space between the image plane and a last optical element on the image-plane side of the projection objective;
wherein the last optical element on the image-plane side of the projection objective is arranged so that, seen in the direction of gravity, it follows the image plane;
wherein the projection objective is configured in such a way that when the system is operating with immersion, the immersion liquid has at least in some areas a convex-curved surface facing in the direction away from the image plane; and
wherein the imaging system is configured to be used in a microlithographic projection exposure apparatus, the image-plane-facing surface of the last optical element is shaped on the image-plane side at least substantially like a spherical shell, and the curvature radius of the image-plane-facing surface of the last optical element on the image-plane side is between 0.9 and 1.5 times as large as the axial distance between the last optical element on the image-plane side and the image plane.

18. An imaging system comprising:
a projection objective that serves to project an image of a mask which can be set into position in an object plane onto a light-sensitive coating layer which can be set into position in an image plane; and
a liquid-delivery device serving to fill immersion liquid into an interstitial space between the image plane and a last optical element on the image-plane side of the projection objective;
wherein the last optical element on the image-plane side of the projection objective is arranged so that, seen in the direction of gravity, it follows the image plane;
wherein the projection objective is configured in such a way that when the system is operating with immersion, the immersion liquid has at least in some areas a convex-curved surface facing in the direction away from the image plane; and wherein the imaging system is configured to be used in a microlithographic projection exposure apparatus, wherein a rotator is provided which serves to rotate a substrate carrying the light-sensitive coating between a transport orientation in which the light-sensitive coating lies on a substrate surface that faces against the direction of gravity and an exposure orientation in which the light-sensitive coating lies on a substrate surface that faces in the direction of gravity.

19. The imaging system according to claim 18, wherein the rotator is designed to perform the turning over of individual wafers which can be taken out of and returned to a wafer-tracking device.

20. The imaging system according to claim 18, wherein the rotator is designed to perform the turning over of a wafer-loading unit which carries the wafer.

21. The imaging system according to claim 18, wherein the last optical element on the image-plane side has a concave-curved surface facing in the direction towards the image plane and bordering on the immersion liquid.

22. The imaging system according to claim 21, wherein the concave-curved surface of the last optical element on the image-plane side extends over an area that substantially fills out the entire contour dimensions of the last optical element as measured parallel to the image plane.

23. The imaging system according to claim 18, wherein the projection objective is a catadioptric objective with at least two concave mirrors, which produces at least two intermediate images.

24. An imaging system comprising:
a projection objective that serves to project an image of a mask which can be set into position in an object plane onto a light-sensitive coating layer which can be set into position in an image plane; and a liquid-delivery device serving to fill immersion liquid into an interstitial space between the image plane and a last optical element on the image-plane side of the projection objective;

wherein the last optical element on the image-plane side of the projection objective is arranged so that, seen in the direction of gravity, it follows the image plane;

wherein the projection objective is configured in such a way that when the system is operating with immersion, the immersion liquid has at least in some areas a convex-curved surface facing in the direction away from the image plane; and wherein the imaging system is configured to be used in a microlithographic projection exposure apparatus, wherein the projection objective is a catadioptric objective with at least two concave mirrors, which produces at least two intermediate images.

25. The imaging system according to claim 24, wherein the last optical element on the image-plane side has a concave-curved surface facing in the direction towards the image plane and bordering on the immersion liquid.

26. The imaging system according to claim 25, wherein the concave-curved surface of the last optical element on the image-plane side extends over an area that substantially fills out the entire contour dimensions of the last optical element as measured parallel to the image plane.

27. The imaging system according to claim 24, wherein a substrate holder is provided which can be selectively actuated to apply a holding force for holding a substrate carrying the light-sensitive coating in an exposure position above the last optical element on the image-plane side.

\* \* \* \* \*

UNITED STATES PATENT AND TRADEMARK OFFICE
CERTIFICATE OF CORRECTION

PATENT NO. : 7,719,658 B2
APPLICATION NO. : 10/597776
DATED : May 18, 2010
INVENTOR(S) : Andreas Dorsel et al.

It is certified that error appears in the above-identified patent and that said Letters Patent is hereby corrected as shown below:

Column 9, line 39, Table 2, under "Surface 35", line 5, delete (second occurrence) "D" and insert --E--.

Column 11, line 25, Claim 9, delete "to-claim" insert --to claim--.

Signed and Sealed this

Third Day of August, 2010

David J. Kappos
*Director of the United States Patent and Trademark Office*